United States Patent
Goward

(10) Patent No.: US 11,024,597 B1
(45) Date of Patent: Jun. 1, 2021

(54) CONNECTING CONDUCTIVE PADS WITH POST-TRANSITION METAL AND NANOPOROUS METAL

(71) Applicant: Facebook Technologies, LLC, Menlo Park, CA (US)

(72) Inventor: John Michael Goward, Ayr (GB)

(73) Assignee: Facebook Technologies, LLC, Menlo Park, CA (US)

( * ) Notice: Subject to any disclaimer, the term of this patent is extended or adjusted under 35 U.S.C. 154(b) by 254 days.

(21) Appl. No.: 15/875,865

(22) Filed: Jan. 19, 2018

(51) Int. Cl.
*H01L 23/48* (2006.01)
*H01L 23/52* (2006.01)
(Continued)

(52) U.S. Cl.
CPC ............ *H01L 24/81* (2013.01); *B23K 20/023* (2013.01); *B23K 35/26* (2013.01);
(Continued)

(58) Field of Classification Search
CPC ......... H01L 24/29; H01L 24/32; H01L 24/81; H01L 33/62; H01L 2224/13026; H01L 2224/13019; H01L 2224/1357; H01L 2224/13618; H01L 2224/13639; H01L 2224/13644; H01L 2224/13647; H01L 2224/16227; H01L 2224/16503; H01L 2224/81193; H01L 2224/81203; H01L 2224/8181; H01L 2924/1033; H01L 2933/0066; H01L 2924/00014; H01L 2224/83013; H01L 2224/2747; H01L 2224/29109; H01L 2224/29111; H01L 2224/29113; H01L 2224/29114; H01L 2224/29117; H01L 2224/29139; H01L 2224/29144; H01L 2224/29155; H01L 2224/29164; H01L 2924/01018; H01L 2924/01058; H01L 2924/14; H01L 2924/00; H01L 2924/01007; H01L 2224/27444; H01L 2224/2908; H01L 2224/29082; H01L 2224/291; H01L 2224/32502; H01L 2224/83005; H01L 2224/83011; H01L 2224/83192; H01L 2224/83203; H01L 2224/8382; H01L 2224/83825; H01L 24/83; H01L 27/153;
(Continued)

(56) References Cited

U.S. PATENT DOCUMENTS

2006/0097354 A1* 5/2006 Ogihara ................. H01L 24/29
257/613
2007/0277866 A1* 12/2007 Sander .................... H01L 35/32
136/230
(Continued)

*Primary Examiner* — Meiya Li
(74) *Attorney, Agent, or Firm* — Fenwick & West LLP

(57) ABSTRACT

A first conductive pad is connected to a second conductive pad by using a post-transition metal and a nanoporous metal. An example of the post-transition metal is indium. An example of the nanoporous metal is nanoporous gold. A block of the post-transition metal is formed on the first conductive pad. The block of the post-transition metal is coated with a layer of anti-corrosion material. A block of the nanoporous metal is formed on the second conductive pad. The block of the post-transition metal and the block of the nanoporous metal are thermal compressed to form an alloy between the first conductive pad and the second conductive pad.

11 Claims, 5 Drawing Sheets

(51) Int. Cl.
  *H01L 29/40*  (2006.01)
  *H01L 23/00*  (2006.01)
  *H01L 33/62*  (2010.01)
  *C22C 5/02*  (2006.01)
  *C22C 28/00*  (2006.01)
  *B23K 35/30*  (2006.01)
  *B23K 35/26*  (2006.01)
  *B23K 20/02*  (2006.01)

(52) U.S. Cl.
  CPC ............ *B23K 35/3013* (2013.01); *C22C 5/02* (2013.01); *C22C 28/00* (2013.01); *H01L 24/29* (2013.01); *H01L 24/32* (2013.01); *H01L 33/62* (2013.01); *H01L 2224/13026* (2013.01); *H01L 2224/1357* (2013.01); *H01L 2224/13109* (2013.01); *H01L 2224/13561* (2013.01); *H01L 2224/13618* (2013.01); *H01L 2224/13639* (2013.01); *H01L 2224/13644* (2013.01); *H01L 2224/13647* (2013.01); *H01L 2224/16227* (2013.01); *H01L 2224/16503* (2013.01); *H01L 2224/8181* (2013.01); *H01L 2224/81193* (2013.01); *H01L 2224/81203* (2013.01); *H01L 2924/1033* (2013.01); *H01L 2924/12041* (2013.01); *H01L 2933/0066* (2013.01)

(58) Field of Classification Search
  CPC . H01L 2924/01005; H01L 2924/01006; H01L 2924/01013; H01L 2924/01015; H01L 2924/01024; H01L 2924/01032; H01L 2924/01033; H01L 2924/01046; H01L 2924/01047; H01L 2924/01049; H01L 2924/0105; H01L 2924/01072; H01L 2924/01073; H01L 2924/01078; H01L 2924/01079; H01L 2924/01322; H01L 2924/07802; H01L 2924/10253; H01L 2924/10329; H01L 2924/10336; H01L 2924/10349; H01L 2924/12041; H01L 2924/12042; H01L 2924/157; H01L 2924/15787; H01L 2924/15788; H01L 2924/1579; B23K 20/023; B23K 35/3013
  USPC .................................................. 257/99–105
  See application file for complete search history.

(56) References Cited

U.S. PATENT DOCUMENTS

2009/0039507 A1* 2/2009 Funaki .................... H01L 24/03
                                                                      257/737
2019/0341536 A1* 11/2019 Choi ........................ H01L 24/29

\* cited by examiner

US 11,024,597 B1

CONNECTING CONDUCTIVE PADS WITH POST-TRANSITION METAL AND NANOPOROUS METAL

BACKGROUND

Field of the Disclosure

The present disclosure generally relates to connecting conductive pads, and specifically to connecting conductive pads by using a post-transition metal and a nanoporous metal.

Description of the Related Arts

Electrodes are often provided on a printed circuit board (PCB) to establish electrical connection with electronic components. These electrodes generally have sufficient height for applying underfill (e.g., resin) between the PCB and the electronic components after the electronic components are mounted onto the PCB. To establish connection, nanoporous metal blocks (such as nanoporous gold blocks) may be formed on electrodes of the PCB or electrical components, and compressed against each other. However, such method may cause reduction in height of the nanoporous metal blocks, which in turn decreases gaps between the electrical components and the PCB to a point that the gaps are too narrow to apply sufficient underfill. Without sufficient underfill, the connection between the PCB and the electronic components may become insecure.

SUMMARY

Embodiments relate to connecting a first conductive pad with a second conductive pad by performing thermal compression at low temperature and pressure. One of the first and second conductive pads conductive pad can be an electrode of a substrate and the other can be an electrode of an electronic component. A block of the post-transition metal is formed on the first conductive pad. A block of nanoporous metal is formed on the second metal. The first conductive pad is thermally compressed toward the second conductive pad to form an alloy between the first conductive pad and the second conductive pad.

In embodiments, the height of the nanoporous metal block is sufficient for applying underfill between the substrate and the electronic component.

In one embodiment, the nanoporous metal is gold and the post-transition metal is Indium.

In one embodiment, the first conductive pad is thermally compressed toward the second conductive pad at a pressure below 8 MPa and at a temperature between 150° C. and 160° C.

In some embodiments, the alloy is gold-indium alloy that includes AuIn, AuIn$_2$, Au$_9$In$_4$, or a combination thereof.

BRIEF DESCRIPTION OF THE DRAWINGS

The teachings of the embodiments can be readily understood by considering the following detailed description in conjunction with the accompanying drawings.

The figures depict various embodiments for purposes of illustration only.

DETAILED DESCRIPTION

In the following description of embodiments, numerous specific details are set forth in order to provide more thorough understanding. However, note that the embodiments may be practiced without one or more of these specific details. In other instances, well-known features have not been described in detail to avoid unnecessarily complicating the description.

Embodiments are described herein with reference to the figures where like reference numbers indicate identical or functionally similar elements. Also in the figures, the left most digits of each reference number corresponds to the figure in which the reference number is first used.

Embodiments relate to connecting a first conductive pad to a second conductive pad using a block of a post-transition metal on the first conductive pad and a block of a nanoporous metal on the second conductive pad at a low pressure and temperature condition. The first conductive pad and the second conductive pad can be made of copper, silver, gold, or some combination thereof. The post-transition metal has a lower melting temperature than transition metals. The block of the post-transition metal and the block of the nanoporous metal are thermally compressed to form an alloy block between the first and second conductive pads.

Figure 1:
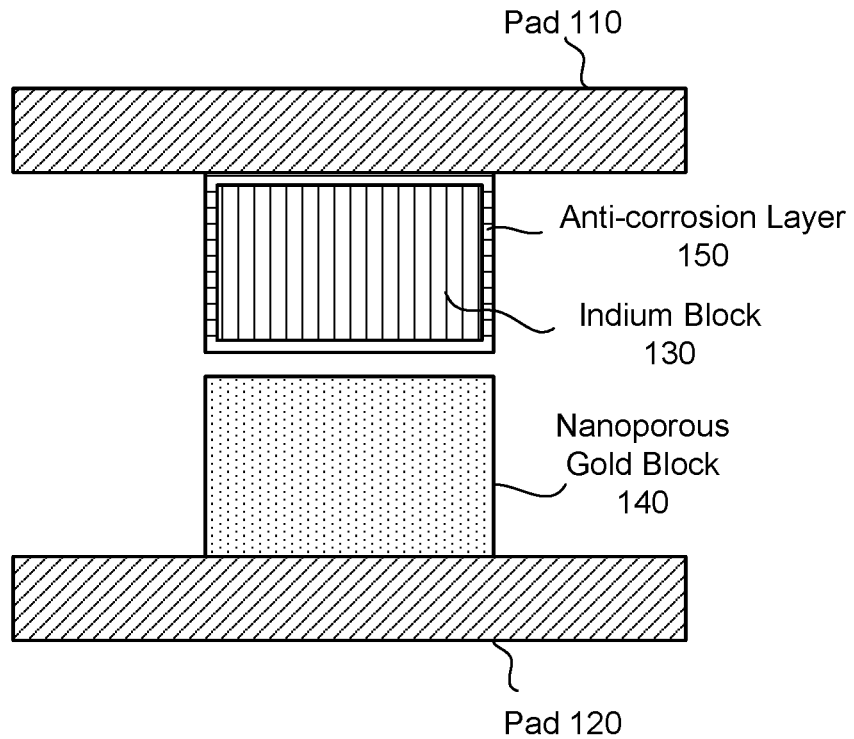
FIGS. 1 and 2 are cross-sectional diagrams illustrating connecting a conductive pad with an indium block and another conductive pad with a nanoporous gold block, in accordance with an embodiment.
Figure 2:
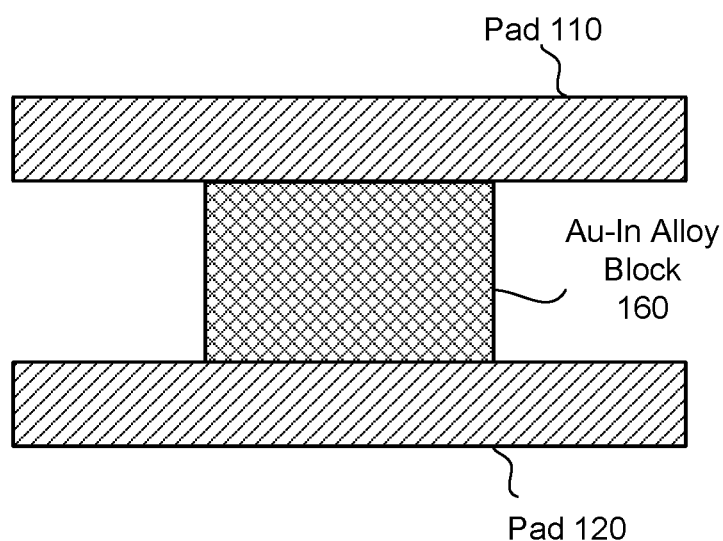

FIGS. 1 and 2 are cross-sectional diagrams illustrating connecting of two conductive pads 110 and 120 with an indium block 130 and a nanoporous gold block 140, in accordance with an embodiment. The conductive pads 110 and 120 can be electrodes of a substrate (e.g., a printed circuit board (PCB)). As shown in FIG. 1, the indium block 130 is formed on the conductive pad 110 and the nanoporous gold block 140 is formed on the conductive pad 120.

The indium block 130 has a height in a range from 10's of microns to sub-micron with an aspect ratio of 1:1 or higher. Indium is a post-transition metal with relatively low melting temperature, e.g., from approximately 150° C. to approximately 160° C. In the embodiment of FIG. 1, the indium block 140 is coated with an anti-corrosion layer 150. The anti-corrosion layer 150 prevents oxidation of the indium block 130. The anti-corrosion layer 150 may be made of anti-corrosion material, such as gold, silver, copper, zinc, or some combination thereof. In some embodiments, the anti-corrosion layer 150 is sputtered onto the indium block 130.

In addition or alternative to indium, the block 130 may include one or more different post-transition metal, such as gallium, tin, thallium, lead, bismuth, or some combination thereof.

The nanoporous gold block 140 has a height in a range from 10's of microns to sub-micron with an aspect ratio of 1:1 or higher. The nanoporous gold block 140 includes a plurality of pores that are distributed across the block. The pores have a size of approximately 100 nm or smaller, dependent upon the amount of gold and the dealloying process conditions to form the nanoporous structure.

In some embodiments, the nanoporous gold block 140 is fabricated by using selective dissolution, which is also known as dealloying. For example, the nanoporous gold block 140 can be fabricated by dealloying Au-based alloy, e.g., Au—Ag alloy. Tertiary alloy compositions such as Au—Ag—Pt could also be employed. During the deploying process, Ag is removed from the alloy in a strong corrosive environment, producing an open pore network structure that consists mostly of Au. Morphology of the nanoporous gold block 140 may be further modified by thermal treatment. For example, the nanoporous gold block 140 may be heated to increase in surface diffusion of gold atoms to increase average pore size.

In addition or alternative to nanoporous gold, the block 140 may include one or more different types of nanoporous metal, such as nanoporous silver, nanoporous copper, or some combination thereof.

A thermal compressing process is conducted to connect the conductive pads 110 and 120. During the thermal compressing process, the conductive pads 110 and 120 are pressed towards each other. In some embodiments, the thermal compressing process is conducted at a pressure less than 8 MPa and a temperature in a range from 150° C. to 160° C. Among other advantages, the low pressure and temperature condition prevents accumulation of thermal stress in electronic components mounted onto the substrate. The pressure and/or temperature of the thermal compression process may vary, e.g., if the block 130 includes a different post-transition metal or the nanoporous gold block 140 has a different average pore size. In one instance, the conductive pad 110 is compressed toward the conductive pad 120 during a plurality cycles of heating and cooling.

During the thermal compression process, indium from the indium block 130 is diffused to the pores of the nanoporous gold block 140 and an Au—In alloy is formed between the two conductive pads 110 and 120. Even though the thermal compression process is conducted at a temperature lower than a melting temperature of gold, the volume of gold present in the nanoporous gold block 140 readily allows the intermetallic formation in the presence of the correct weight percentage of indium.

FIG. 2 shows that an Au—In alloy block 160 is formed between the two conductive pads 110 and 120 at low temperatures between 150° C. to 160° C. The Au—In alloy block 160 can include 50%-67% atomic percent of indium to predominantly form $AuIn_2$ as well as AuIn. In some embodiments, the Au—In alloy block 160 includes AuIn, $AuIn_2$, $Au_9In_4$, or some combination thereof. The Au—In alloy 160 has a higher melting temperature than the indium block 130. In one embodiment, the melting temperature of the Au—In alloy is at least 450° C. Also, the Au—In alloy block 160 has good electrical conductivity and mechanical properties. More details about the Au—In alloy block 160 are described in conjunction with FIG. 3.

Because the pressure of the thermal compressing is below 8 MPa, the height of the nanoporous gold block 140 is not significantly reduced by the thermal processing process. Compared to convention processes where the thermal compressing is performed above 8 MPa, the relatively low pressure of the embodiments enable the overall height of the nanoporous gold block 140 to be retained. The Au—In alloy block 160 has a height similar to that of the nanoporous gold block 140. For example, the height of the Au—In alloy block 160 is in the range from 10's of microns to sub-micron with an aspect ratio of 1:1 or higher. The height of the Au—In alloy block 160 ensures that there is sufficient gap between the conductive pads 110 and 120 to facilitate applying underfill between the conductive pads 110 and 120. In some embodiments, the gaps between the conductive pads 110 and 120 are filled with resin.

Figure 3:
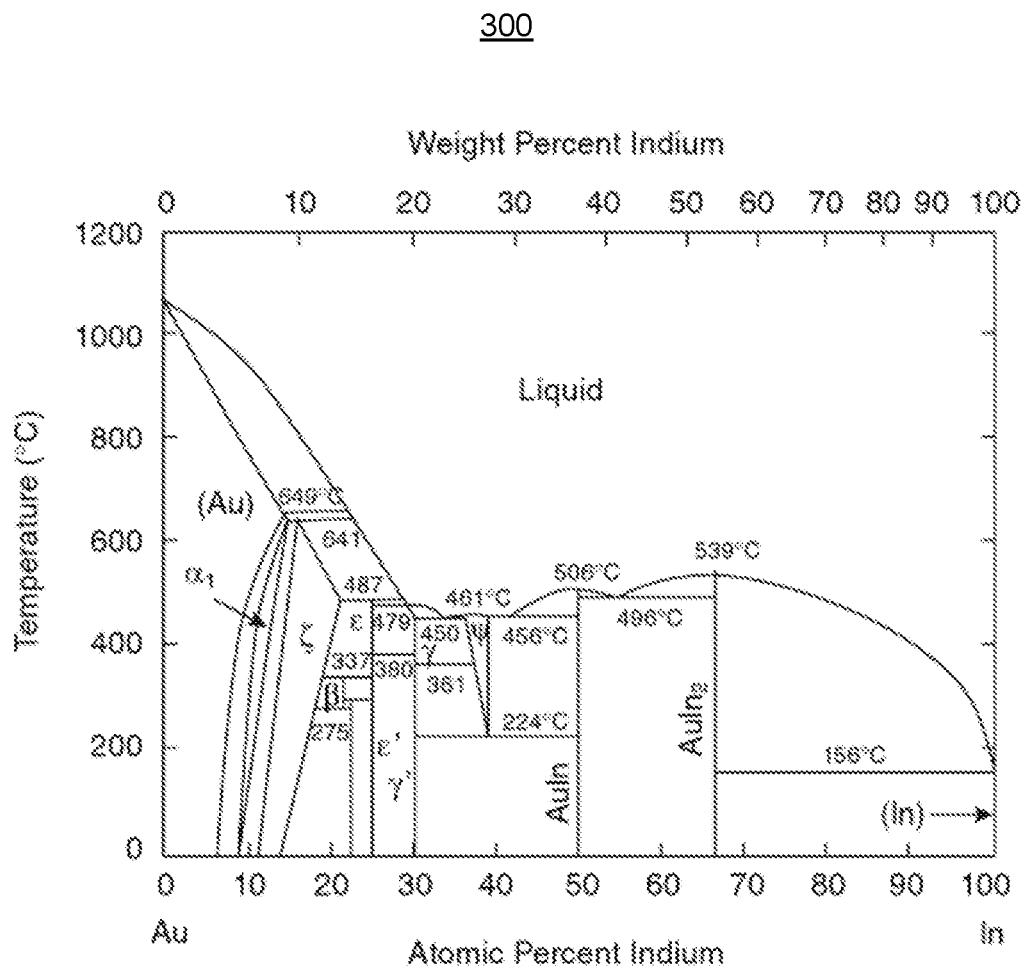
FIG. 3 is an example gold-indium phase diagram, in accordance with an embodiment.

FIG. 3 is an example gold-indium phase diagram 300, in accordance with an embodiment. The phase diagram 300 shows phases of gold-indium alloy as a function of temperature and composition at atmospheric pressure. The phase diagram 300 is a melting point diagram for gold-indium alloy. As shown in FIG. 3, the melting temperature of gold (where the atomic percent of indium is 0%) is approximately 1050° C. and the melting temperature of indium (where the atomic percent of indium is 100%) is 156° C.

FIG. 3 shows that AuIn is formed when an Au—In alloy including 50% atomic percent indium heated at a temperature between 150° C. and 160° C. AuIn has a melting point of 506° C. Also, $AuIn_2$ is formed when an Au—In alloy including approximately 67% atomic percent indium heated at a temperature between 150° C. and 160° C. $AuIn_2$ has a melting temperature of 539° C. A mixture of AuIn and $AuIn_2$ is formed when an Au—In alloy including 50%-67% atomic percent indium heated at a temperature between 150° C. and 160° C. The mixture may also include $Au_9In_4$. The mixture has a melting temperature above 496° C.

Figure 4:
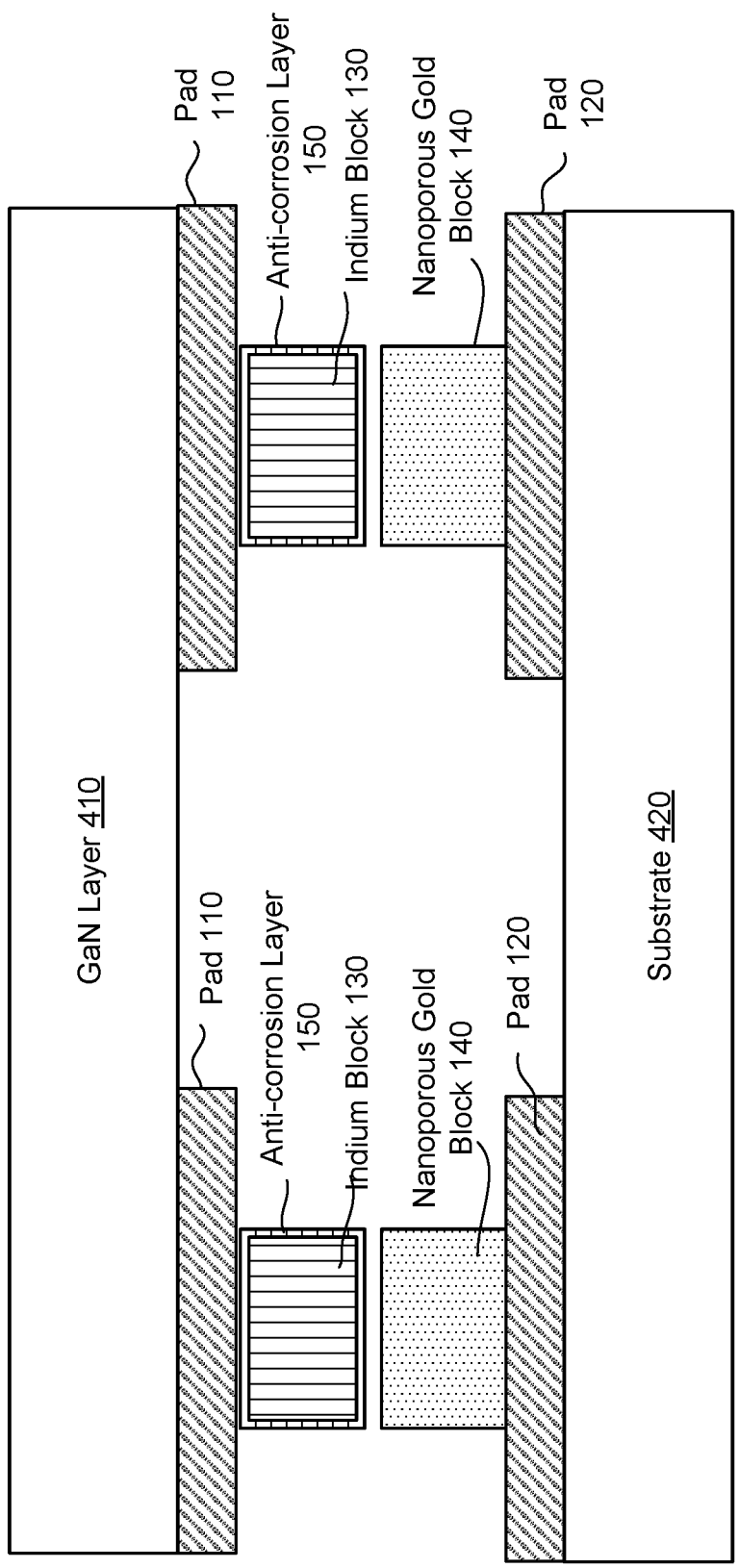
FIG. 4 is an example semiconductor device including conductive pads connected to counterpart conductive pads of a substrate using a post-transition metal and a nanoporous metal, in accordance with an embodiment.

FIG. 4 is an example semiconductor device including conductive pads 110 connected to counterpart conductive pads 120 of a substrate 420 using a post-transition metal and a nanoporous metal, in accordance with an embodiment. The semiconductor device may be, for example, a micro light emitting diode (LED) including a GaN layer 410. The substrate 420 may include a conductive trace and/or electrical circuit (not shown in FIG. 4) to provide electrical current to the GaN layer 410.

An indium block 130 is formed on each of the conductive pads 110 and may be coated with an anti-corrosion layer 150. In one embodiment, the anti-corrosion layer 150 includes is a layer of gold. A nanoporous gold block 140 is formed on each of the conductive pads 120.

The GaN layer 410 is thermally compressed toward the substrate 420 to electrically connect the conductive pads 110, 120. In some embodiments, the thermal compression is conducted at a pressure below 8 MPa and a temperature in a range from 150° C. to 160° C. After the thermal compressing, Au—In alloy blocks are formed between the GaN layer 410 and the substrate 420. Each of the Au—In alloy blocks is the Au—In alloy block 160 described above in conjunction with FIG. 1. The Au—In alloy block maintains height of the nanoporous gold block 140 and also has good electrical conductivity.

Figure 5:
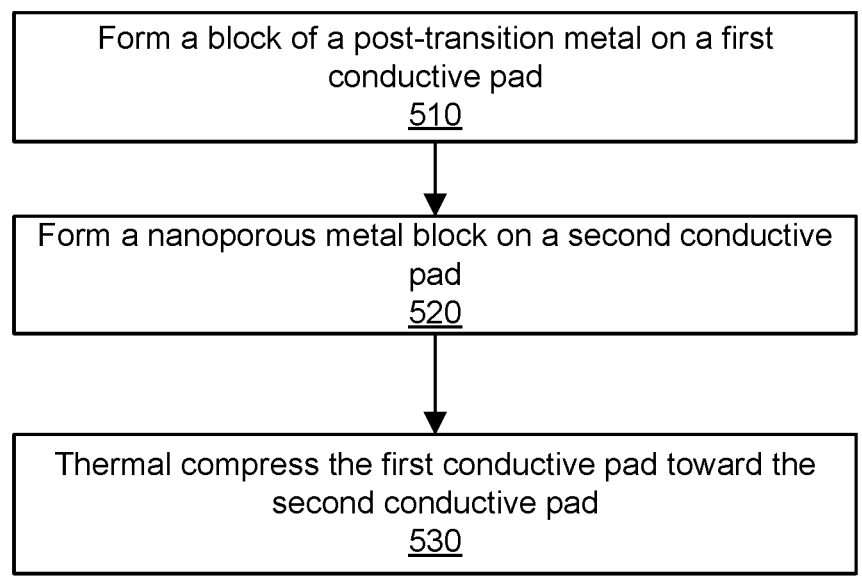
FIG. 5 is a flow chart illustrating a process for connecting two conductive pads by using a post-transition metal and a nanoporous metal, in accordance with an embodiment.

FIG. 5 is a flow chart illustrating a process for connecting two conductive pads by using a post-transition metal and a nanoporous metal, in accordance with an embodiment. The process may include different or additional steps than those described in conjunction with FIG. 5 in some embodiments or perform steps in different orders than the order described in conjunction with FIG. 5.

The process includes forming 510 a block of a post-transition metal on a first conductive pad. The post-transition metal is a metal with low melting point. An example of the post-transition metal is indium. The block of the post-transition metal has a height in a range from 10's of micron to sub-micron with an aspect ratio of 1:1 or higher. In some embodiments, the block of the post-transition metal is coated with a layer of anti-corrosion material. The anti-corrosion material can be gold, copper, silver, zinc, or some combination thereof.

The process also includes forming 520 a nanoporous metal block on a second conductive pad. The nanoporous metal block has a height in a range from 10's of microns to sub-micron with an aspect ratio of 1:1 or higher. In some embodiments, the nanoporous metal is gold.

The process further includes thermally compressing 530 the first conductive pad toward the second conductive pad to form an alloy between them. In some embodiments, a layer of oxide from the block of the post-transition metal is removed before the thermal compressing. The thermal compressing is performed at a pressure no greater than 8 MPa and a temperature in the range from 150° C. to 160° C. In some embodiments, the first conductive pad is thermal compressed toward the second conductive pad during cycles of heating the first conductive pad and the second conductive pad. The first conductive pad and the second conductive pad are cooled between the heating cycles. In embodiments where the post-transition metal is indium and the nanoporous metal is gold, the alloy includes at least one of the following: AuIn, $AuIn_2$, $Au_9In_4$, or a combination thereof. An embodiment of the alloy includes 50%-67% atomic percent of Indium.

Figure 6:
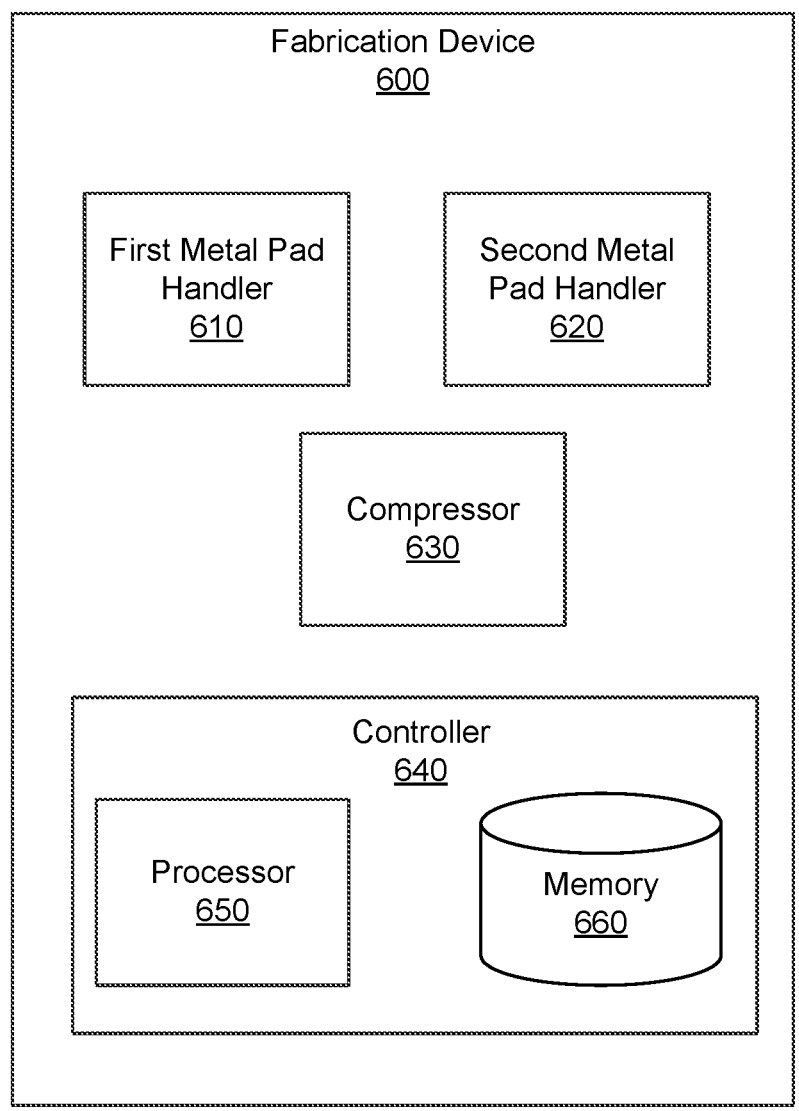
FIG. 6 is a block diagram of a fabrication device, in accordance with an embodiment.

FIG. 6 is a block diagram of a fabrication device 600, in accordance with an embodiment. The fabrication device 600 electrically connects and mounts a semiconductor device to a substrate. The fabrication device 600 may include, among other components, a first conductive pad handler 610, a second conductive pad handler 620, a compressor 630, and a controller 640. Some embodiments of the fabrication device 600 have different components than those described here. Similarly, the functions can be distributed among the components in a different manner than is described here. For example, the controller 640 or one or more modules thereof may be located on one of the other components of the fabrication device 600.

The first conductive pad handler 610 is a component that forms a block of post-transition metal (e.g., indium) on the first conductive pad. In some embodiments, the first conductive pad handler 610 further removes a layer of oxide from the surface of the block of the post-transition metal. The first conductive pad handler 610 may also coat the block of the post-transition metal with a layer of anti-corrosion material. An example of the anti-corrosion material is gold.

The second conductive pad handler 620 forms a block of nanoporous metal (e.g., nanoporous gold) on the second conductive pad. The second conductive pad handler may form the block of the nanoporous metal by using selective dissolution. For example, the second conductive pad handler forms a block of Au—Ag alloy on the second conductive pad and then removes Ag from the block by dealloying, which produces nano-sized pores in the block.

The compressor 630 compresses the first conductive pad toward the second conductive pad at a pressure below 8 MPa and a temperature in a range from 150° C. to 160° C. In some embodiments, the compressor 630 compresses the first conductive pad toward the second conductive pad during multiple heating cycles and cools the first conductive pad and the second conductive pad between the heating cycles.

The controller 640 controls the first conductive pad handler 610, the second conductive pad handler 620, and the compressor 630. For example, the controller 640 sends instructions of how to form the block of the post-transition metal to the first conductive pad handler 610, sends instructions of how to form the block of the nanoporous metal to the second conductive pad handler 620, and sends instructions for the thermal compressing to the compressor 630.

As shown in FIG. 6, the controller 640 includes a processor 650 and a memory 660. The processor 650 executes the instructions to control the first conductive pad handler 610, the second conductive pad handler 620, and the compressor 630. The processor 650 is coupled to the memory 660. The memory 660 stores instructions and data used by the processor 650. In some embodiments, the memory 660 is a non-transitory computer-readable storage medium, such as a hard drive, compact disk read-only memory (CD-ROM), DVD, or a solid-state memory device.

As is known in the art, a controller 640 can have different and/or other components than those shown in FIG. 6. For example, the controller 640 further includes input devices, such as a pointing device (a mouse, track ball, or other type of pointing device), a keyboard, or other type of input devices. The controller 640 may further includes a display device that displays images and other information regarding the fabrication of the semiconductor device.

The controller 640 is adapted to execute computer modules for providing the functionality described herein. As used herein, the term "module" refers to computer program instruction and other logic for providing a specified functionality. A module can be implemented in hardware, firmware, and/or software. A module can include one or more processes, and/or be provided by only part of a process. A module is typically stored on the memory 660 and executed by the processor 650.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method for connecting a first conductive pad to a second conductive pad, comprising:
   forming a block of a post-transition metal on the first conductive pad;
   forming a nanoporous metal block on the second conductive pad, the nanoporous metal block formed with a plurality of nano-sized pores; and
   pressing the first conductive pad and the second conductive pad towards each other, the post-transition metal diffusing into the plurality of nano-sized pores of the nanoporous metal block to form an alloy between the first conductive pad and the second conductive pad.

2. The method of claim 1, further comprising:
   coating the block of the post-transition metal with a layer of anti-corrosion material before the pressing.

3. The method of claim 2, wherein the anti-corrosion material is selected from gold, copper, silver or and zinc.

4. The method of claim 1, wherein the nanoporous metal block has a height in a range from 10's of microns to submicron.

5. The method of claim 1, wherein the nanoporous metal block is a nanoporous gold block.

6. The method of claim 1, wherein the post-transition metal is Indium.

7. The method of claim 6, wherein the alloy includes AuIn, $AuIn_2$, $Au_9In_4$, or a combination thereof.

8. The method of claim 6, wherein the alloy includes 50%-67% atomic percent of Indium.

9. The method of claim 1, wherein the step of pressing is performed at a pressure no greater than 8 MPa and a temperature in a range from 150° C. to 160° C.

10. The method of claim 1, wherein the step of pressing comprises pressing the first conductive pad and the second conductive pad towards each other during a plurality of cycles of heating and cooling.

11. The method of claim 1, wherein the first conductive pad is a part of a semiconductor device, and the second conductive pad is a part of a substrate.

\* \* \* \* \*